United States Patent [19]
Kuo et al.

[11] Patent Number: 5,168,466
[45] Date of Patent: Dec. 1, 1992

[54] BIAS CURRENT GENERATOR CIRCUIT FOR A SENSE AMPLIFIER

[75] Inventors: Clinton C. Kuo; Thomas R. Toms; Mark S. Weidner, all of Austin, Tex.

[73] Assignee: Motorola, Inc., Schaumburg, Ill.

[21] Appl. No.: 664,147

[22] Filed: Mar. 4, 1991

[51] Int. Cl.[5] .............................................. G11C 13/00
[52] U.S. Cl. .................................... 365/185; 365/218; 365/900
[58] Field of Search ..................... 365/185, 189.01, 218

[56] References Cited
U.S. PATENT DOCUMENTS
5,101,379 3/1992 Lin et al. ............................. 365/185

Primary Examiner—Terrell W. Fears
Attorney, Agent, or Firm—Robert L. King

[57] ABSTRACT

A bias voltage generator (12) provides a bias control voltage that is connected to a gate of transistor (32) to sink a predetermined amount of bias current. The bias voltage generator (12) is also connected to a gate of a transistor (31) to limit the voltage to a selected bit-line within an array of flash EEPROM cells (26). The predetermined bias current is summed with the current from a selected flash EEPROM cell (46). A reference current generator portion (22), establishes both a reference current and a reference voltage at a second input to a differential amplifier (35). A current-voltage (I-V) characteristic curve of the reference voltage at the second input of the differential amplifier is approximately symmetrically located between the I-V characteristic curves of a flash EEPROM cell when the logic state of the flash EEPROM cell is in an erased state and a programmed state.

9 Claims, 3 Drawing Sheets

BIAS CURRENT GENERATOR CIRCUIT FOR A SENSE AMPLIFIER

FIELD OF THE INVENTION

This invention relates generally to sense amplifier circuits, and more particularly a bias current generator circuit for a sense amplifier.

BACKGROUND OF THE INVENTION

A known problem with a flash EEPROM cell is that the difference in current of a selected flash EEPROM cell in the programmed logic state and the erased logic state is small. When the selected flash EEPROM cell is in a programmed logic state, current through the selected flash EEPROM cell is limited to a small value. When the selected flash EEPROM cell is in an erased logic state, the current through the selected flash EEPROM cell is increased. As the difference in current between a selected flash EEPROM in programmed logic state and an erased logic state becomes smaller, improvements in sense amplifiers are needed.

Another known problem with a flash EEPROM cell is that repeated read accessing of a flash EEPROM cell may inadvertently disturb a predetermined logic state of the flash EEPROM cell. When the predetermined logic state of the flash EEPROM cell has been disturbed, subsequent read accesses of the flash EEPROM cell are adversely affected. The adverse affects include, but are not limited to, a slower data resolution time, and incorrect data resolution from the flash EEPROM cell. The problem of disturbing the logic state of a flash EEPROM cell during a read operation is exasperated when the sense amplifier circuit that senses the logic state of the flash EEPROM cell has a high voltage on a bit-line for a logic sensing operation. Known solutions to solving the problem of disturbing the logic state of a flash EEPROM cell during repeated read operations include, but are not limited to, designing a flash EEPROM cell that is not sensitive to logic state disturbing, and utilizing sense amplifier circuits that operate at low voltages to prevent disturbing the logic state of the flash EEPROM cell. A problem with utilizing known sense amplifier circuits for detecting low cell currents is that the read access speed of the flash EEPROM cell is degraded.

Therefore, there is a need to provide a sense amplifier with a high sensitivity to detect small differences in current that operates at high speed without inadvertently disturbing the logic state of flash EEPROM cells.

SUMMARY OF THE INVENTION

The previously mentioned needs are fulfilled with the present invention. A bias current generator circuit for a sense amplifier, and method of operation, comprises a storage device having a control terminal for receiving a select signal. The storage device is selectively programmed to a predetermined logic state. A data bus is coupled to the storage device. A voltage regulation portion selectively provides a predetermined regulated voltage. A load is coupled to the data bus for selectively pre-charging the data bus and sourcing current to the storage device. A sense amplifier is coupled to the storage device and the data bus for sensing current conducted by the storage device through the data bus. A bias current portion is coupled to the data bus and the load for selectively shunting current from the data bus and storage device in response to the predetermined regulated voltage. The bias current portion comprises a transistor having a first current-voltage operating characteristic which is substantially identical with a second current-voltage operating characteristic of the storage device.

These and other features, and advantages, will be more clearly understood from the following detailed description taken in conjunction with the accompanying drawings.

DESCRIPTION OF A PREFERRED EMBODIMENT

Typically the current sinking capability of a flash EEPROM cell in an erased logic state is significantly greater than a flash EEPROM cell in a programmed logic state. However for various reasons, such as programming disturb, read disturb and scaling, the current difference between two logic states of the flash EEPROM cell in an erased and a programmed logic state can become degraded. Therefore, there is a need for a sense amplifier that can detect small differences in current, i.e. high sensitivity, at a fast rate without disturbing a logic state of the flash EEPROM cell. Described below is a sense amplifier scheme which utilizes a current biasing technique, in accordance with the present invention, with the above stated improvements.

Figure 1:
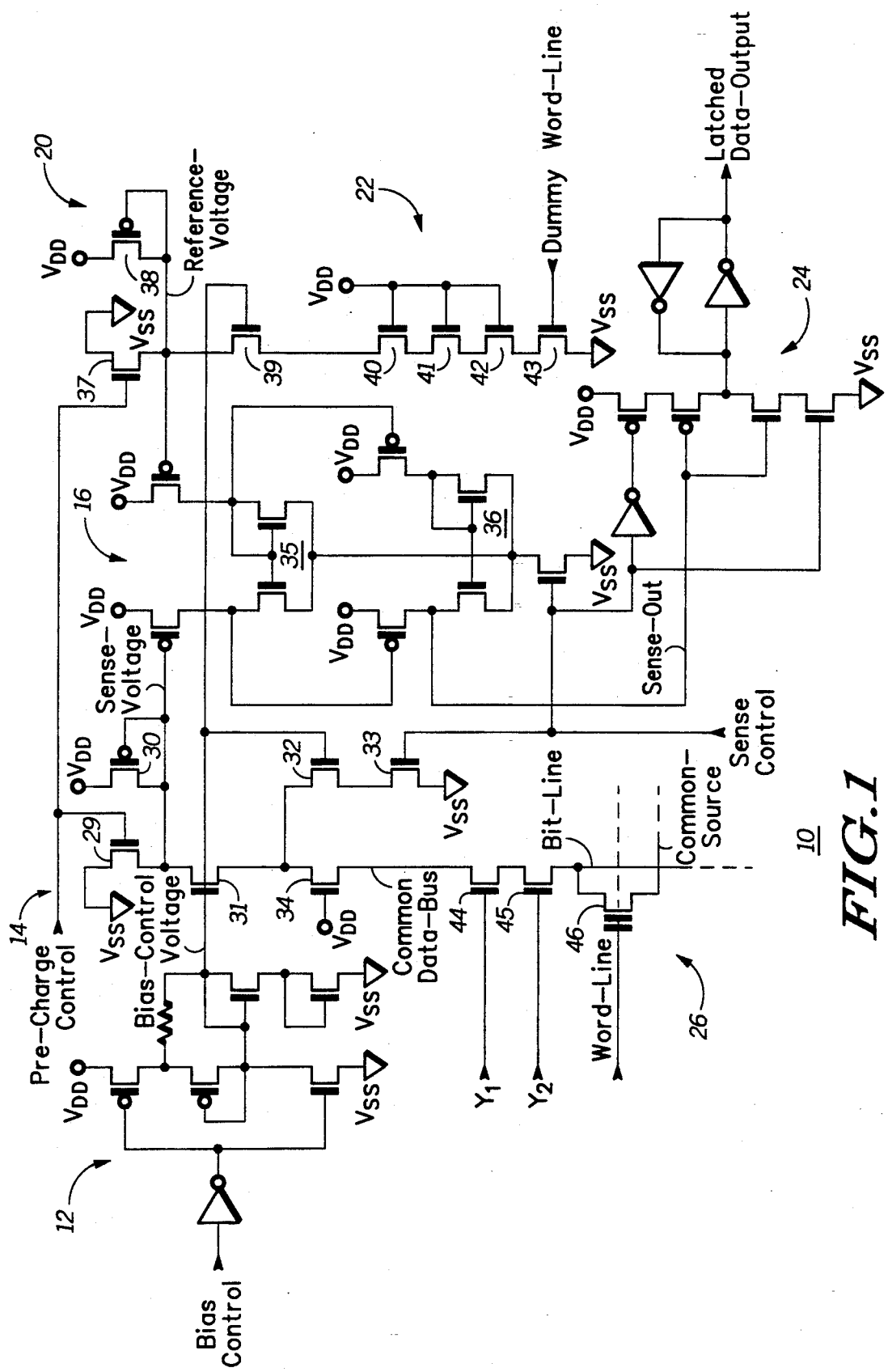
FIG. 1 illustrates in logic diagram form a flash EEPROM circuit in accordance with the present invention.

Flash EEPROM circuit 10 of FIG. 1 has a bias voltage generator portion 12, a pre-charge and bias portion 14, an amplifier portion 16, a reference voltage bias portion 20, a reference current generator portion 22, a data-output latch portion 24, and a flash EEPROM cell with decode portion 26. The pre-charge and bias portion 14 has transistors 29-34. Transistor 30 is a P-channel MOS transistor and serves as a load device while transistors 29, 31-34 are N-channel MOS transistors.

The bias voltage generator portion 12 has an input to receive a control signal labeled "bias-control," and an output connected to an input of the pre-charge and bias portion 14 labeled "bias-control voltage." Referring to the pre-charge and bias portion 14, transistor 29 has a gate terminal which is connected to an input control signal labeled "pre-charge control," a source terminal connected to a reference power supply terminal labeled "$V_{ss}$," and a drain terminal connected to a node labeled "sense-voltage." Load transistor 30 has a gate and a drain terminal both connected to the sense-voltage node, and a source terminal connected to a positive power supply labeled "$V_{dd}$." Transistor 31 has a gate terminal connected to the bias-control voltage, a drain terminal connected to the sense-voltage node, a source terminal connected to a drain terminal of transistors 32 and 34. Transistor 32 has a gate terminal connected to bias-control voltage, and a source terminal connected to a drain terminal of transistor 33. Transistor 33 has a gate terminal connected to an input control signal labeled "sense-control," and a source terminal connected to $V_{ss}$. Transistor 34 has a gate terminal connected to $V_{dd}$, and a source terminal connected to a node labeled "common data-bus." The amplifier portion 16 is a two stage differential amplifier consisting of a differential sense amplifier 35, and a differential sense amplifier 36. Differential sense amplifiers 35 and 36 are connected in a cascading fashion, that is the differential output of differential sense amplifier 35 is connected to the differential input of differential sense amplifier 36. Differential sense amplifier 35 has a first input connected to sense-voltage, and a second input connected to a node labeled "reference-voltage." The differential sense amplifier 36 has an input to receive the signal labeled "sense-control," and an output connected to an input of the data-output latch portion 24 labeled "sense-out." The reference voltage bias portion 20 has transistors 37–39, an input to receive the pre-charge control signal, and an output at the reference-voltage node. Transistors 37–39 are respectively identical in size and circuit characteristics to transistors 29–31. Transistor 38 serves as a load device. The reference current generator portion 22 has transistors 40–43, and an input to receive a signal labeled "dummy wordline." The data-output latch portion 24 has a control input connected to sense-control, and a latched output labeled "latched data-output." Data-output latch 24 is a conventional latching circuit. The flash EEPROM cell with decode portion 26 has transistors 44–46, two column select signals respectively labeled "Y$_1$" and "Y$_2$," and a word-line select signal labeled "word-line." Transistor 46 is a flash EEPROM cell, and transistors 44–45 represent decoding transistors for selectively connecting the common data-bus to a selected bit-line. The flash EEPROM cell 46 has a control gate terminal connected to the word-line select signal, and a source terminal connected to a node labeled "common-source." Transistors 34, 44–45, are respectively identical in size and circuit characteristics to transistors 40–42 of the reference current generator portion 22. Transistor 31 of pre-charge and bias portion 14 is identical in size and circuit characteristic as transistor 39 of the reference voltage bias portion 20. In the preferred embodiment, transistor 32 of the pre-charge and bias portion 14, and transistor 43 of the reference current generator portion 22 each has a current-voltage (I-V) characteristic curve that is similar to the I-V characteristic curve of flash EEPROM cell 46 when flash EEPROM cell 46 is in an erased logic state.

Figure 2:
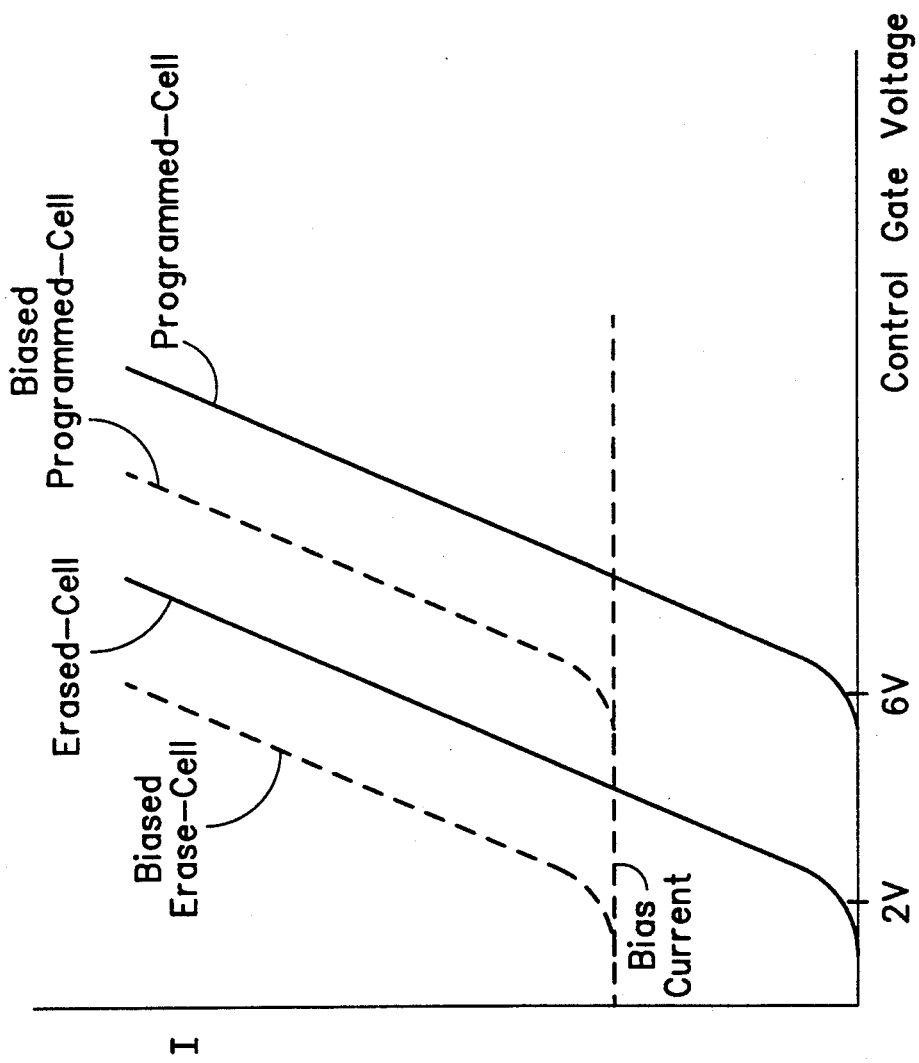
FIG. 2 illustrates in graphical form current-voltage characteristics of a flash EEPROM circuit in accordance with the present invention.

Illustrated in FIG. 2 are the I-V characteristic curves for a typical flash EEPROM cell in an erased logic state, and a programmed logic state respectively labeled "erased-cell" and "programmed-cell." The erased-cell curve will be utilized as a reference curve. A horizontal line labeled "bias current" represents a predetermined bias current provided by transistor 32 within the pre-charge and bias portion 14 of FIG. 1. When the predetermined bias current is summed with the current of an erased-cell, a characteristic curve labeled "biased erase-cell" is formed. Likewise, when the predetermined bias current is summed with the current of a programmed-cell, a characteristic curve labeled "biased programmed-cell" is formed. The characteristic curves for both the biased erase-cell and the biased programmed-cell are illustrated in FIG. 2. Note that the characteristic curve for the erased-cell is approximately symmetrically located between the characteristic curves for the biased programmed-cell and the biased erased-cell.

In operation, the bias voltage generator portion 12 provides a predetermined voltage to an input of the pre-charge and bias portion 14 which is, for this discussion, approximately two N-channel threshold voltages, two-(V$_{ts}$), above V$_{ss}$. In response to the bias-control voltage at the gate of transistor 31, transistor 31 limits the voltage at the source terminal of transistor 31 to about one-V$_t$ above V$_{ss}$. Since the gate terminal of transistor 34 is connected to V$_{dd}$, the voltage at the source terminal of transistor 31 is fully coupled to the common data-bus. In response to the bias-control voltage at the gate terminal of transistor 32, transistor 32 sinks a predetermined amount of current when transistor 33 is activated. A ratio of size between transistor 29 and load transistor 30 determines a quiescent state voltage at the sense-voltage node when transistor 29 is activated. Since the size of transistor 29 and load transistor 30 are respectively identical to the size of transistors 37 and 38, a quiescent state voltage at the reference-voltage node is identical to the quiescent state voltage at the sense-voltage node. When transistors 39–43 are activated, a predetermined amount of current is conducted from the reference-voltage node to V$_{ss}$, and the voltage at the reference-voltage node is lowered a predetermined amount. The I-V characteristic curve for the voltage at the reference-voltage node when transistors 39–43 are activated is illustrated in FIG. 2 as the erased-cell. Since the erased-cell I-V curve is approximately symmetrically located between the biased erase-cell curve and the biased programmed-cell curve, a variation in voltage between the reference-voltage node and the sense-voltage node is quickly detected via the differential sense amplifier 35. When the selected flash EEPROM cell 46 is in an erased state, and the decode signals Y$_1$, Y$_2$ and the word-line signals are active, the selected flash EEPROM cell 46 sinks a predetermined amount of current from load transistor 30 and the voltage at the sense-voltage node is lower than the reference-voltage. Since the voltage at the sense-voltage node is now lower than the voltage at the reference-voltage node, amplifier portion 16 provides a predetermined voltage signal at the sense-out node which is latched by the data-output latch portion 24. For the example above where the sense-voltage is lower in voltage than the reference-voltage, the output of the data-output latch portion 24 is a voltage level low. When the selected flash EEPROM cell 46 is in a programmed state, and the decode signals Y$_1$, Y$_2$ and the word-line signals are active, the selected flash EEPROM cell 46 sinks only a small amount of current, the voltage at the sense-voltage node is higher than the reference-voltage. Since the voltage at the sense-voltage node is higher in voltage than the reference-voltage node, amplifier portion 16 provides a predetermined voltage signal at the sense-out node which is latched by the data-output latch portion 24. The voltage level at the output of the data-output latch portion 24 for the condition when the sense-voltage is greater in voltage than the reference-voltage, is a voltage level high.

Figure 3:
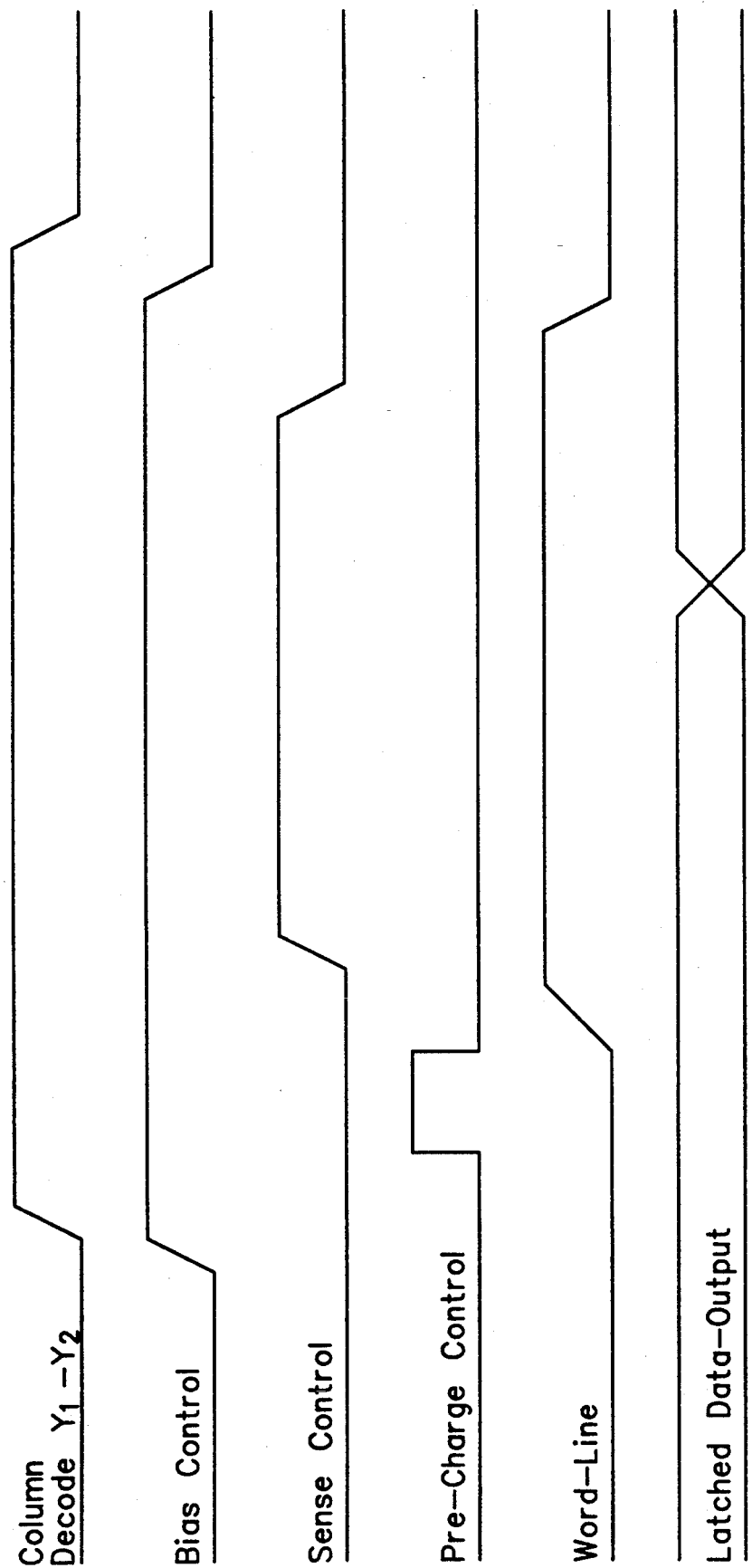
FIG. 3 illustrates in graphical form a timing diagram in accordance with the present invention.

In more detail, FIG. 3 illustrates a timing diagram for a typical read access of the flash EEPROM circuit 10 of FIG. 1. The column decode signals Y$_1$ and Y$_2$ become active which selectively connects the common data-bus to a predetermined bit-line. In response to the bias-control voltage, a predetermined bias voltage is established at the bias-control voltage terminal, and transistors 31 and 39 are activated. In response to an activated pre-charge control signal, transistors 29 and 37 are enabled which results in a predetermined voltage to be respectively established at the sense-voltage and reference-voltage nodes. The predetermined established voltage at the sense-voltage node is used to both pre-charge the selected bit-line, as well as to initialize the voltage at the sense-voltage node to a predetermined voltage. The word-line signal is activated near the time period that the pre-charge control signal is deactivated. In response to an active word-line signal, the control gate of flash EEPROM cell 46 is enabled. As discussed previously, when the selected flash EEPROM cell 46 is in an erased state, the selected flash EEPROM cell 46 sinks a predetermined amount of current, and when the selected flash EEPROM cell 46 is in a programmed state, the selected flash EEPROM cell 46 sinks less current. In response to the current sinking capability of the selected flash EEPROM cell 46 and the bias transistor 32, a predetermined voltage is established at the sense-voltage node, the first input to differential sense amplifier 35. The predetermined voltage at the first input to the differential sense amplifier 35 is voltage compared with the reference-voltage at the second input to the differential sense amplifier 35. Differential sense amplifier 36 amplifies the output of differential sense amplifier 35 to produce a predetermined voltage at sense-out. The voltage at sense-out is latched via the data-output latch portion 24 at a predetermined time. The latching of sense-out by the data-output latch portion 24 is illustrated in FIG. 3 with the signal labeled "latched data-output."

In summary, bias voltage generator portion 12 produces a bias control voltage which enables bias transistor 32 to sink a predetermined amount of current. When transistor 29 is activated, a predetermined quiescent voltage is established at a first input to differential amplifier 35. Likewise, when transistor 37 is activated a predetermined reference voltage is established at a second input to differential amplifier 35. The voltage at the first input to differential amplifier 35 is greater than the reference voltage at the second input to differential amplifier 35. The I-V characteristic curve at the second input to differential amplifier 35 is approximately symmetrically located between the I-V characteristic curves of a flash EEPROM cell in an erased state summed with a predetermined bias current, and a flash EEPROM cell in a programmed state summed with a predetermined bias current. When a selected flash EEPROM cell is in an erased state, the voltage at the first input to the differential amplifier 35 is lower than the reference-voltage. When a selected flash EEPROM cell is in a programmed state, the voltage at the first input to the differential amplifier is higher than the reference-voltage. By utilizing transistors that emulate the I-V curve characteristics of an erased flash EEPROM cell, a reference voltage is created. As mentioned previously, the reference voltage is connected to the second input of differential amplifier 35. By providing a bias current to be summed with the current of a selected flash EEPROM cell, the I-V characteristic curves of the selected flash EEPROM cell in both an erased and programmed state are shifted.

By utilizing a bias control voltage that is approximately two $V_{t's}$ above $V_{ss}$, the voltage on both a common data-bus and a selected bit-line is voltage swing limited. By limiting the voltage swing on the selected bit-line during a read access operation, higher sensitivity to small current differences as well as faster logic state sensing of the selected flash EEPROM cell is achieved without disturbing the logic state of the flash EEPROM cell. By providing a reference I-V curve that is approximately symmetrically located between both a biased erased-cell and a biased programmed-cell, a substantial increase in access speed of the logic state of a selected flash EEPROM cell is achieved.

By now it should be apparent that although a flash EEPROM cell is illustrated, various other memory cells may be implemented. Although a two stage differential amplifier is illustrated, various other sense amplifier schemes may be implemented. Although a bias voltage generator is implemented that will operate at a low voltages, other bias voltage generators may be implemented. Although the preferred embodiment utilizes bias transistors that have similar I-V characteristic curves, other methods of implementation where the I-V characteristic curves are not similar are possible. It is also possible implement transistor 43 and the bias transistor 32 to be identical to the memory cell 46. Although specific N-channel and P-channel MOS transistors are discussed, it should be well understood that the present invention may be implemented with other types of transistors and transistors having other conductivities.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A bias current generator circuit for a sense amplifier, comprising:
    a storage device having a control terminal for receiving a select signal, the storage device being selectively programmed to a predetermined logic state;
    a data bus coupled to the storage device;
    a voltage regulation means for selectively providing a predetermined regulated voltage;
    a load coupled to the data bus for selectively pre-charging the data bus and sourcing current to the storage device;
    a sense amplifier coupled to the storage device and the data bus for sensing current conducted by the storage device through the data bus; and
    bias current means coupled to the data bus and the load for selectively shunting current from the data bus and storage device in response to the predetermined regulated voltage, said bias current means comprising a transistor having a first current-voltage operating characteristic which is substantially identical with a second current-voltage operating characteristic of the storage device.

2. The bias current generator circuit of claim 1 wherein the sense amplifier is a differential sense amplifier having a first input coupled to the load and bias current means, and a second input coupled to a reference voltage provided by a reference voltage means.

3. The bias current generator circuit of claim 2 wherein the reference voltage means comprises a transistor having a third current-voltage operating characteristic substantially identical to the second current-voltage operating characteristic of the storage device when said storage device is selected and in a predetermined first logic state.

4. In a memory having a sense amplifier and a storage device, a method of sensing current in the storage device, comprising the steps of:
    selectively programming the storage device to a predetermined logic state;

coupling a data bus to the storage device;
providing a predetermined regulated voltage;
selectively pre-charging the data bus and sourcing current to the storage device;
sensing current conducted by the storage device through the data bus; and
selectively shunting current from the data bus and the storage device in response to the predetermined regulated voltage by using a transistor having a first current-voltage operating characteristic which is substantially identical with a second current-voltage operating characteristic of the storage device.

5. The method of sensing current of claim 4 wherein the step of sensing current conducted by the storage device further comprises sensing current with a differential input sense amplifier having a first input for selectively receiving an input voltage which is proportional to the predetermined regulated voltage and a second input for receiving a reference voltage.

6. The method of sensing current of claim 5 wherein the step of sensing current with a differential input sense amplifier having a second input for receiving a reference voltage further comprises generating the reference voltage with a reference circuit having a transistor with a third current-voltage operating characteristic substantially identical to the second current-voltage operating characteristic of the storage device when said storage device is selected and in a predetermined first logic state and to the second current-voltage operating characteristic.

7. A bias current generator circuit for a sense amplifier, comprising:
a non-volatile memory cell having a control terminal for receiving a select signal, the non-volatile memory cell being selectively programmed to a predetermined logic state;
a bit-line coupled to the non-volatile memory cell;
a voltage regulation means for selectively providing a predetermined regulated voltage;
a load coupled to the bit-line for selectively pre-charging the bit-line and sourcing current to the non-volatile memory cell;
a sense amplifier coupled to the non-volatile memory cell and the data bus for sensing current conducted by the non-volatile memory cell through the bit-line; and
bias current means coupled to the bit-line and the load for selectively shunting current from the bit-line and non-volatile memory cell in response to the predetermined regulated voltage, said bias current means comprising a transistor having a first current-voltage operating characteristic which is substantially identical with a second current-voltage operating characteristic of the non-volatile memory cell.

8. The bias current generator circuit of claim 7 wherein the sense amplifier is a differential sense amplifier having a first input coupled to the load and bias current means, and a second input coupled to a reference voltage provided by a reference voltage means.

9. The bias current generator circuit of claim 8 wherein the reference voltage means comprises a transistor having a third current-voltage operating characteristic substantially identical to the second current-voltage operating characteristic of the non-volatile memory cell when said non-volatile memory cell is selected and in a predetermined first logic state.

* * * * *